(12) United States Patent
Hatakeyama et al.

(10) Patent No.: US 7,354,693 B2
(45) Date of Patent: Apr. 8, 2008

(54) POLYMER, RESIST PROTECTIVE COATING MATERIAL, AND PATTERNING PROCESS

(75) Inventors: Jun Hatakeyama, Joetsu (JP); Yoshio Kawai, Joetsu (JP); Kazuhiko Maeda, Tokyo (JP); Haruhiko Komoriya, Kawagoe (JP); Michitaka Ootani, Kawagoe (JP)

(73) Assignees: Shin-Etsu Chemical Co., Ltd., Tokyo (JP); Central Glass Co., Ltd., Ube-shi (JP)

( * ) Notice: Subject to any disclaimer, the term of this patent is extended or adjusted under 35 U.S.C. 154(b) by 260 days.

(21) Appl. No.: 11/196,450

(22) Filed: Aug. 4, 2005

(65) Prior Publication Data

US 2006/0029884 A1    Feb. 9, 2006

(30) Foreign Application Priority Data

Aug. 5, 2004  (JP) ............................. 2004-229085
May 27, 2005  (JP) ............................. 2005-155103

(51) Int. Cl.
*G03F 7/00* (2006.01)
*G03F 7/004* (2006.01)
*C08F 218/00* (2006.01)

(52) U.S. Cl. ................ 430/270.1; 526/72; 526/319; 526/321; 526/320

(58) Field of Classification Search ............ 430/270.1, 430/273.1, 281.1, 286.1
See application file for complete search history.

(56) References Cited

U.S. PATENT DOCUMENTS

| | | | |
|---|---|---|---|
| 5,541,037 A | | 7/1996 | Hatakeyama et al. |
| 5,861,232 A | * | 1/1999 | Kanda et al. ............. 430/281.1 |
| 7,122,293 B2 | * | 10/2006 | Sugasaki et al. ......... 430/273.1 |
| 2003/0152864 A1 | * | 8/2003 | Araki et al. ............. 430/270.1 |
| 2003/0186160 A1 | * | 10/2003 | Ito ........................... 430/270.1 |
| 2004/0236046 A1 | * | 11/2004 | Miyazawa et al. .......... 526/245 |
| 2005/0250898 A1 | * | 11/2005 | Maeda et al. ............... 524/544 |
| 2006/0036005 A1 | * | 2/2006 | Kanda et al. ................. 524/55 |
| 2006/0188804 A1 | * | 8/2006 | Allen et al. .............. 430/270.1 |

FOREIGN PATENT DOCUMENTS

| | | | |
|---|---|---|---|
| EP | 1176467 A1 | * | 1/2002 |
| JP | 60-038821 A | | 2/1985 |
| JP | 60042411 A | * | 3/1985 |
| JP | 62-62520 A | | 3/1987 |
| JP | 62-62521 A | | 3/1987 |
| JP | 05-74700 A | | 3/1993 |
| JP | 06-272926 A | | 9/1994 |
| JP | 2803549 B2 | | 7/1998 |
| JP | 2002040652 A | * | 2/2002 |
| WO | WO 02/066526 A1 | * | 8/2002 |

OTHER PUBLICATIONS

English language abstract of JP 60-42411.*

(Continued)

*Primary Examiner*—Amanda Walke
(74) *Attorney, Agent, or Firm*—Birch, Stewart, Kolasch & Birch, LLP

(57) ABSTRACT

In an immersion lithography process, a pattern is formed by forming a photoresist layer on a wafer, forming a protective coating on the photoresist layer from an overlay material, exposing the layer structure to light in water, and developing. A water-insoluble, alkali-soluble material is used as the overlay material.

8 Claims, 5 Drawing Sheets

OTHER PUBLICATIONS

Ito et al, "Novel Fluorpolymers for Use in 157nm Lithography", J. of Photopolymer Science and Technology, vol. 14, No. 4, pp. 583-594 (2001).*

Lin, B.J, Proc. SPIE vol. 4690 p. XXIX-XLII.

Owa, Soichi et al., Proc. SPIE vol. 5040, p. 724-733 (2003).

Hirayama, The 2nd Immersion Workshop, Jul. 11, 2003, Resist and Cover Material Investigation for Immersion Lithography.

* cited by examiner

IMMERSION TARC n1.3

IMMERSION TARC n1.4

IMMERSION TARC n1.45

IMMERSION TARC n1.5

IMMERSION TARC n1.55

IMMERSION TARC n1.6

IMMERSION TARC n1.65

IMMERSION TARC n1.7

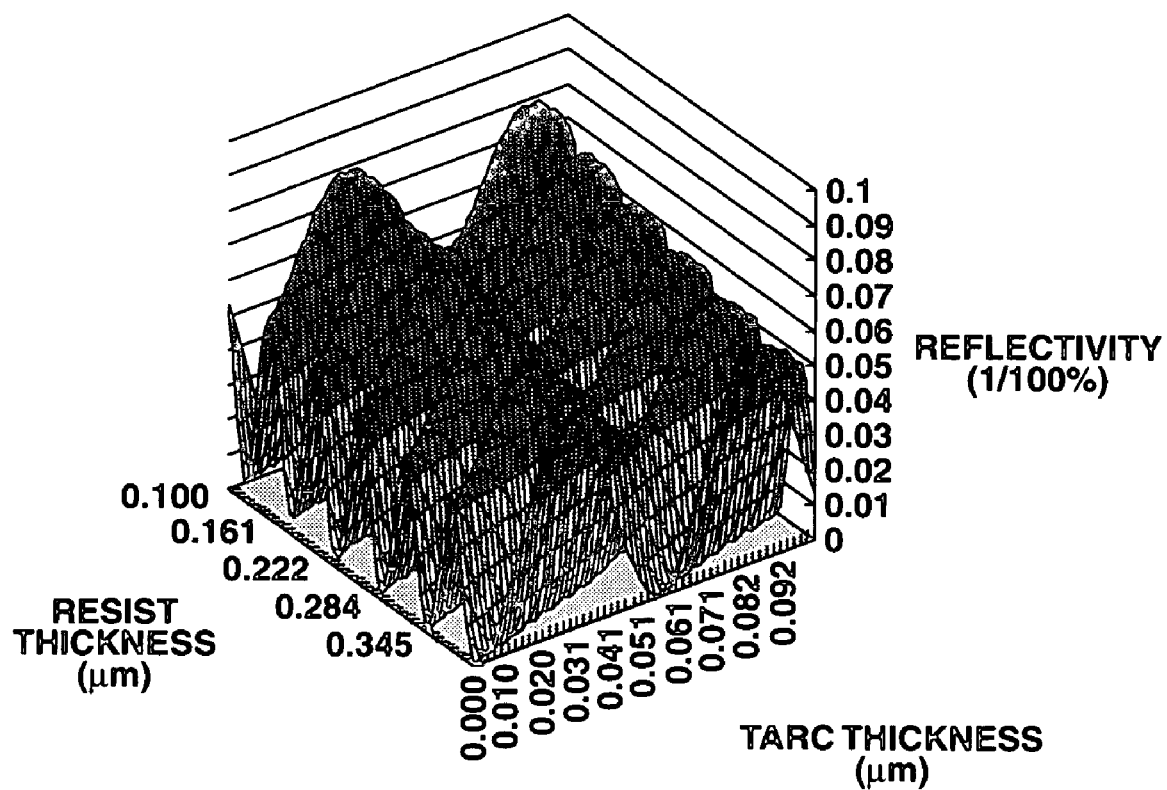

POLYMER, RESIST PROTECTIVE COATING MATERIAL, AND PATTERNING PROCESS

CROSS-REFERENCE TO RELATED APPLICATION

This non-provisional application claims priority under 35 U.S.C. §119(a) on Patent Application Nos. 2004-229085 and 2005-155103 filed in Japan on Aug. 5, 2004 and May 27, 2005, respectively, the entire contents of which are hereby incorporated by reference.

TECHNICAL FIELD

This invention generally relates to a micropatterning process for the fabrication of semiconductor devices, and particularly to an immersion lithography process involving directing radiation having a wavelength of 180 to 250 nm, especially ArF excimer laser radiation having a wavelength of 193 nm from a projection lens toward a wafer, with water intervening between the lens and the wafer. More particularly, it relates to a polymer used as a photoresist protective coating in the immersion lithography, a resist protective coating material, and a process for forming a resist pattern using the same.

BACKGROUND ART

In the recent drive for higher integration and operating speeds in LSI devices, the pattern rule is made drastically finer. The photolithography which is currently on widespread use in the art is approaching the essential limit of resolution determined by the wavelength of a light source.

As the light source used in the lithography for resist pattern formation, g-line (436 nm) or i-line (365 nm) from a mercury lamp was widely used. One means believed effective for further reducing the feature size is to reduce the wavelength of exposure light. For the mass production process of 64 M-bit dynamic random access memory (DRAM, processing feature size 0.25 μm or less), the exposure light source of i-line (365 nm) was replaced by a KrF excimer laser having a shorter wavelength of 248 nm.

However, for the fabrication of DRAM with a degree of integration of 256 M and 1 G or more requiring a finer patterning technology (processing feature size 0.2 μm or less), a shorter wavelength light source is required. Over a decade, photolithography using ArF excimer laser light (193 nm) has been under active investigation. It was expected at the initial that the ArF lithography would be applied to the fabrication of 180-nm node devices. However, the KrF excimer lithography survived to the mass-scale fabrication of 130-nm node devices. So, the full application of ArF lithography started from the 90-nm node.

The ArF lithography combined with a lens having an increased numerical aperture (NA) of 0.9 is considered to comply with 65-nm node devices. For the next 45-nm node devices which required an advancement to reduce the wavelength of exposure light, the $F_2$ lithography of 157 nm wavelength became a candidate.

However, for the reasons that the projection lens uses a large amount of expensive $CaF_2$ single crystal, the scanner thus becomes expensive, hard pellicles are introduced due to the extremely low durability of soft pellicles, the optical system must be accordingly altered, and the etch resistance of resist is low; the postponement of $F_2$ lithography and the early introduction of ArF immersion lithography were advocated (see Proc. SPIE Vol. 4690 xxix).

In the ArF immersion lithography, the space between the projection lens and the wafer is filled with water. Since water has a refractive index of 1.44 at 193 nm, pattern formation is possible even using a lens with NA of 1.0 or greater. Theoretically, it is possible to increase the NA to 1.44. The resolution is improved by an increment of NA. A combination of a lens having NA of at least 1.2 with ultra-high resolution technology suggests a way to the 45-nm node (see Proc. SPIE Vol. 5040, p 724).

Several problems associated with the presence of water on resist were pointed out. For example, profile changes occur because the acid once generated from a photoacid generator and the amine compound added to the resist as a quencher can be dissolved in water. The pattern collapses due to swelling. It was then proposed to provide a protective coating between the resist and water (see the 2nd Immersion Workshop, Jul. 11, 2003, Resist and Cover Material Investigation for Immersion Lithography).

In the lithography history, the protective coating on the resist layer was studied as an antireflective coating. For example, the antireflective coating on resist (ARCOR) process is disclosed in JP-A 62-62520, JP-A 62-62521, and JP-A 60-38821. The ARCOR process involves forming a transparent antireflective coating on top of a resist film and stripping it after exposure. Despite its simplicity, the process can form a micropattern at a high degree of definition, precision and alignment. When the antireflective coating is made of perfluoroalkyl compounds (e.g., perfluoroalkyl polyethers or perfluoroalkyl amines) having a low refractive index, the light reflection at the resist/antireflective coating interface is minimized so that the dimensional precision is improved. In addition to these materials, the fluorinated materials proposed thus far include amorphous polymers such as perfluoro(2,2-dimethyl-1,3-dioxol)-tetrafluoroethylene copolymers and cyclic polymers of perfluoro(allyl vinyl ether) and perfluorobutenyl vinyl ether as disclosed in JP-A 5-74700.

Because of their low compatibility with organic substances, the foregoing perfluoroalkyl compounds must be diluted with fluorocarbon solvents such as Fremion for controlling a coating thickness. As is well known in the art, the use of fluorocarbons now raises an issue from the standpoint of environmental protection. The perfluoroalkyl compounds are awkward to form uniform films, and are not regarded satisfactory as antireflective films. Additionally, the antireflective films must be stripped with fluorocarbon solvents prior to the development of photoresist. These factors lead to many practical disadvantages including a need to add an antireflective film-stripping unit to the existing system and the increased cost of fluorocarbon solvents If the antireflective film is to be stripped without adding an extra unit to the existing system, it is most desirable to carry out stripping in the development unit. The solutions used in the photoresist development unit are an alkaline aqueous solution as the developer and deionized water as the rinse. It would be desirable to have an antireflective coating material which can be readily stripped with such solutions. For this reason, there were proposed a number of water-soluble antireflective coating materials and patterning processes using the same. See, for example, JP-A 6-273926 and Japanese Patent No. 2,803,549.

The water-soluble protective coatings, however, cannot be used in the immersion lithography because they are dissolved away in water during light exposure. On the other hand, water-insoluble fluoro-polymers pose a need for special fluorocarbon strippers and an exclusive stripping cup for fluorocarbon solvents. It was thus desired to have a resist protective coating which is water insoluble, but can be readily stripped.

The ideal refractive index of an antireflective coating on resist is a square root of the refractive index of air multiplied by the refractive index of the resist film. Since ArF resist films based on methacrylate and cycloolefin polymers have a refractive index of approximately 1.72 at 193 nm, for lithography in air, the optimum refractive index of the overlay film is a square root of 1.72, which is calculated to be 1.31. For immersion lithography wherein the immersion medium is water, for example, the optimum is a square root of the refractive index 1.44 of water multiplied by the refractive index 1.72 of the resist film, which is calculated to be 1.57.

Fluoro-polymers, which are reported in the 2nd Immersion Workshop, Jul. 11, 2003, Resist and Cover Material Investigation for Immersion Lithography, have a low refractive index of 1.38 which is far off the optimum value.

SUMMARY OF THE INVENTION

An object of the invention is to provide a polymer which is insoluble in water, dissolvable in aqueous alkaline solution, and immiscible with resist films so that it enables pattern formation by the immersion lithography; a resist protective coating material comprising the same; and a process for forming a pattern using the same.

The inventors have discovered that when pattern formation by immersion lithography is carried out on a wafer by directing light having a wavelength in the range of 180 to 250 nm toward the wafer through a projection lens and intervening a water-containing liquid between the projection lens and the wafer, better results are obtained using a protective coating made of a material comprising recurring units having the general formula (1), shown below, as the resist overlay material. Since this protective coating is insoluble in water, dissolvable in aqueous alkaline solution, and immiscible with the resist film, the protective coating is amenable to immersion lithography over a wider range in that it can be simultaneously stripped altogether during development of the resist film in alkaline water.

The inventors performed a simulation of immersion lithography at wavelength 193 nm, with the results shown in FIGS. 1 to 9. Assume a layer structure including, in sequence, a Si substrate, an antireflective coating (BARC) having a refractive index (n) 1.5, an extinction coefficient (k) 0.4, and a thickness 85 nm, a resist layer having a refractive index 1.72, and a resist protective coating (or top antireflective coating, TARC). When the refractive index and thickness of TARC and the thickness of the resist layer were varied, the reflectivity from TARC to water was computed. The reflectivity varies periodically as the thickness of TARC and the thickness of resist vary. The thickness of TARC (pointed by the arrow) when the reflectivity of resist becomes minimum is the optimum TARC thickness. The target value of reflectivity is set at 2% or less (reflectivity$\leq$0.02). Where the refractive index of TARC (=1.3, 1.4) is lower than that of water, the reflectivity exceeds 4%. A reflectivity of 2% or less is obtained when the refractive index of TARC is 1.55, 1.60 and 1.65. It is thus seen that a refractive index of approximately 1.57 is the optimum.

The resist protective coating must provide a definite barrier between water and the resist layer and be immiscible with the resist layer. Of polymers comprising recurring units of formula (1), shown below, a homopolymer consisting of recurring units (a) has a glass transition temperature (Tg) of approximately 110° C. The simultaneous achievement of stripping of the resist protective coating and development of the resist layer during the development with alkaline water indicates that post-exposure baking (PEB) is carried out with the protective coating lying on the resist layer. There is a possibility of intermixing between the resist layer and the protective coating during the PEB. To prevent the intermixing between the resist layer and the protective coating, the protective coating must have a higher Tg. The inventors have found that copolymerization with (meth)acrylic acid and especially, copolymerization with a (meth)acrylic compound having a cyclic structure with pendant carboxyl groups is effective for elevating the Tg. The present invention is predicated on this finding.

Therefore, the present invention provides a polymer, a resist protective coating material for use in the immersion lithography, and a patterning process by the immersion lithography, as defined below.

In a first aspect, the invention provides a polymer comprising recurring units having the general formula (1).

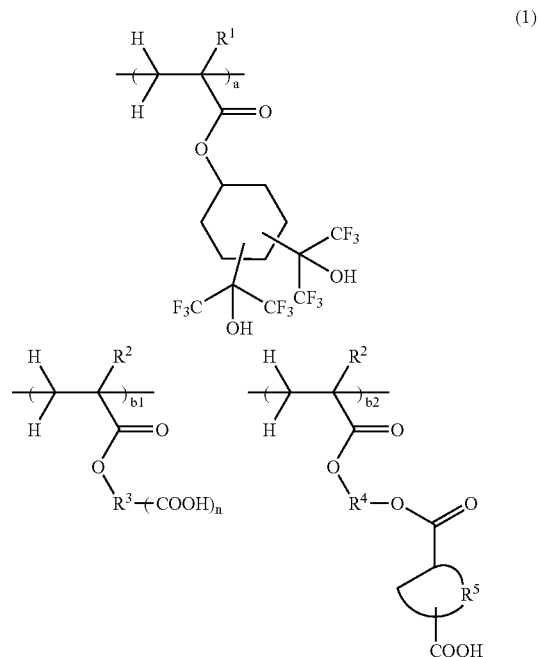

Herein $R^1$ and $R^2$ each are hydrogen or methyl, $R^3$ is a $C_1$-$C_{12}$ alkylene group when n=1 or an $C_1$-$C_{12}$ alkylidyne group when n=2, which has a straight, branched or cyclic structure, $R^4$ is a $C_1$-$C_{12}$ alkylene group which has a straight, branched or cyclic structure, $R^5$ is a $C_1$-$C_{12}$ alkylene group, subscripts a, $b_1$ and $b_2$ are numbers in the range: 0<a<1, 0$\leq$$b_1$<1, 0$\leq$$b_2$<1, 0<$b_1$+$b_2$<1, 0<a+$b_1$+$b_2$$\leq$1.0, and n is equal to 1 or 2.

In a second aspect, the invention provides a resist protective coating material comprising the polymer.

In a third aspect, the invention provides an immersion lithography process for forming a pattern, comprising the steps of forming a resist layer on a wafer, forming a protective coating on the resist layer from a resist overlay material, and exposing the layer structure to light having a wavelength in the range of 180 to 250 nm through an projection lens while keeping a water-containing liquid between the projection lens and the wafer, wherein the resist overlay material is the resist protective coating material defined above. The pattern forming process may further comprise, after the exposing step, the steps of post-exposure baking and then developing the layer structure with alkaline water, the developing step serving to develop the resist layer and strip the protective coating of resist overlay material at the same time.

Since the resist protective coating material which is insoluble in water, soluble in aqueous alkaline solution (or alkaline developer) and immiscible with the resist layer is used, the pattern forming process of the invention is successful in carrying out immersion lithography in a satisfactory manner and simultaneously achieving both stripping of the protective coating and development of the resist layer during the development with alkaline water.

BRIEF DESCRIPTION OF THE DRAWINGS

FIG. 9 is a graph of simulated reflectivity for TARC having a refractive index of 1.8.

DESCRIPTION OF THE PREFERRED EMBODIMENTS

Figure 1:
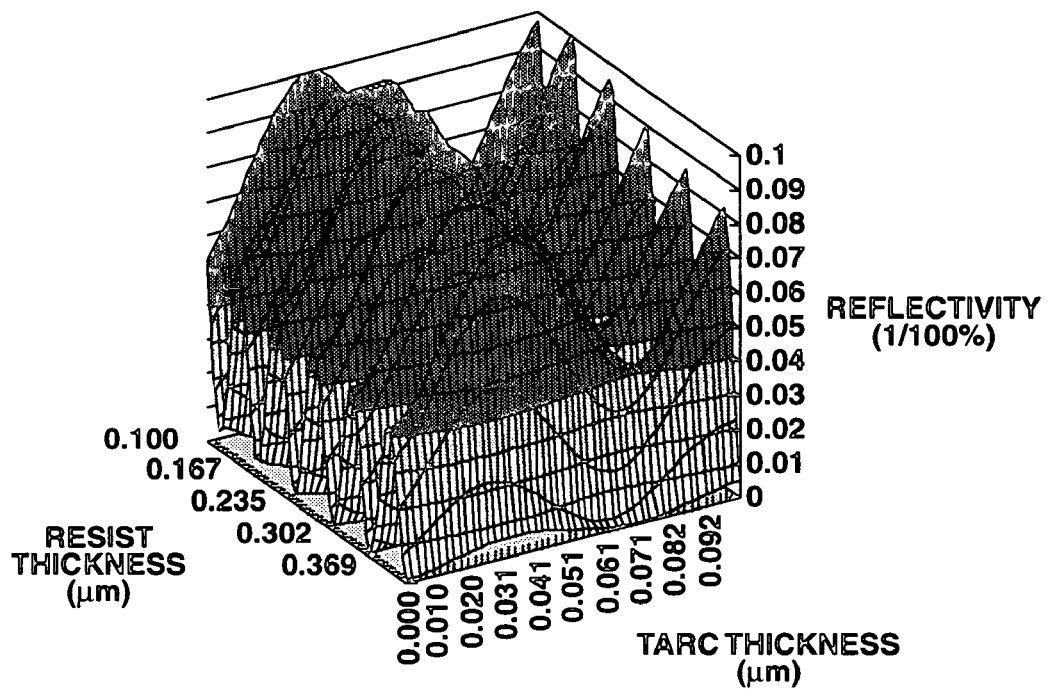
FIG. 1 is a graph of simulated reflectivity for a resist overlay protective coating (TARC) having a refractive index of 1.3 as a function of resist thickness and TARC thickness.
Figure 2:
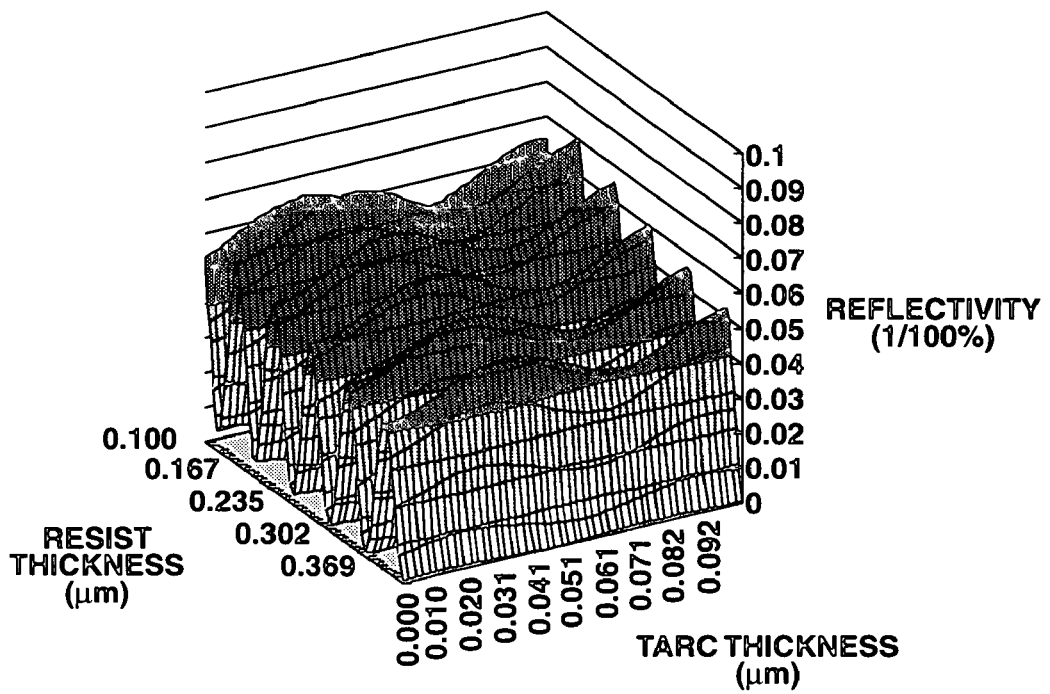
FIG. 2 is a graph of simulated reflectivity for TARC having a refractive index of 1.4.
Figure 3:
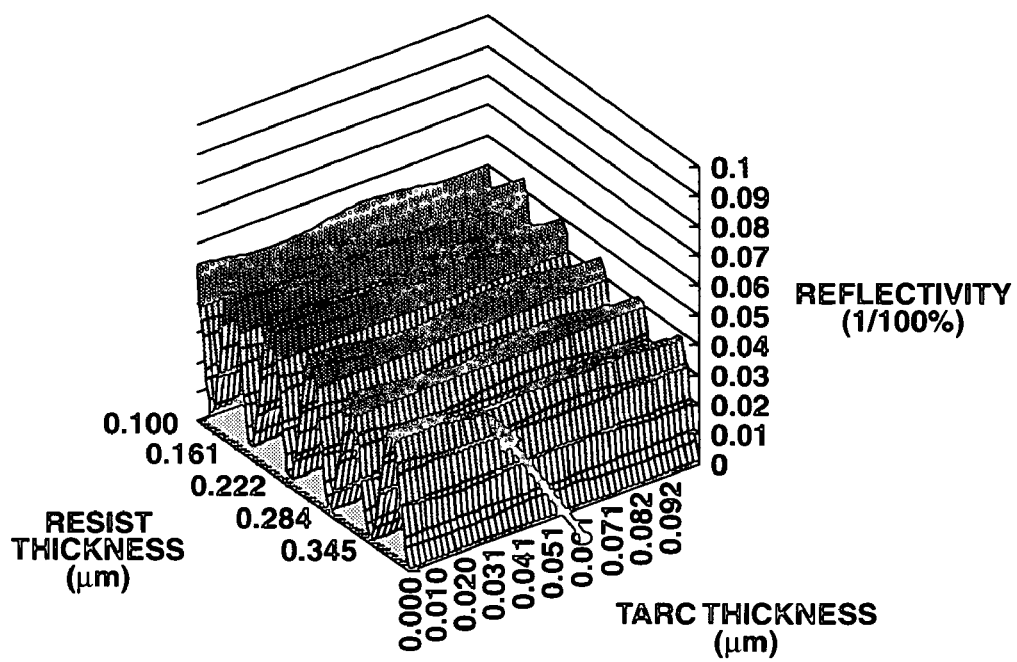
FIG. 3 is a graph of simulated reflectivity for TARC having a refractive index of 1.45.
Figure 4:
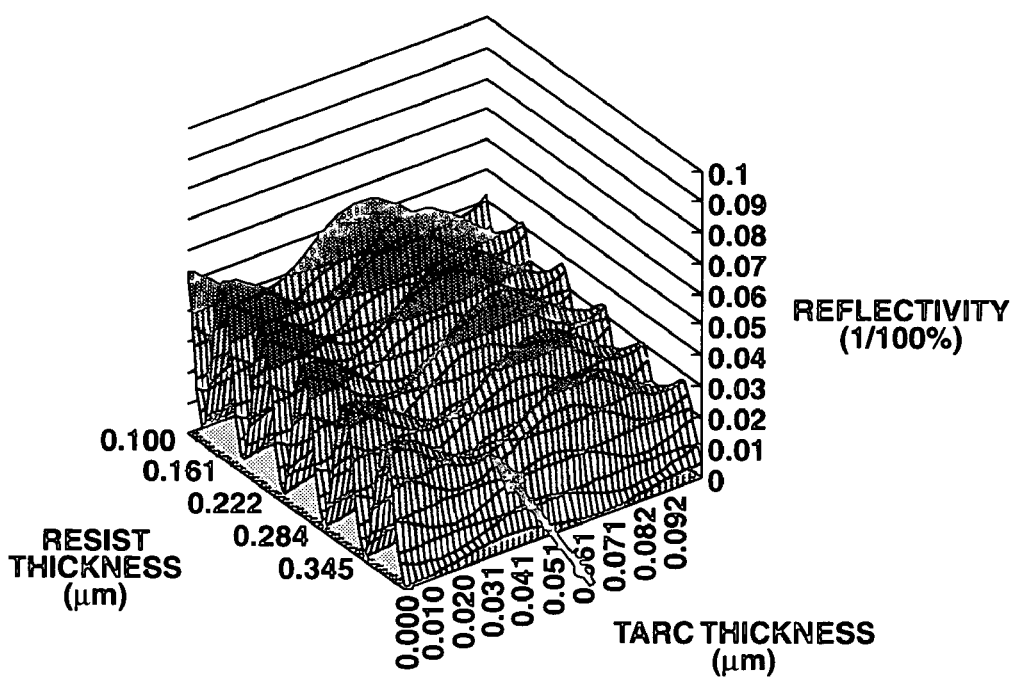
FIG. 4 is a graph of simulated reflectivity for TARC having a refractive index of 1.5.
Figure 5:
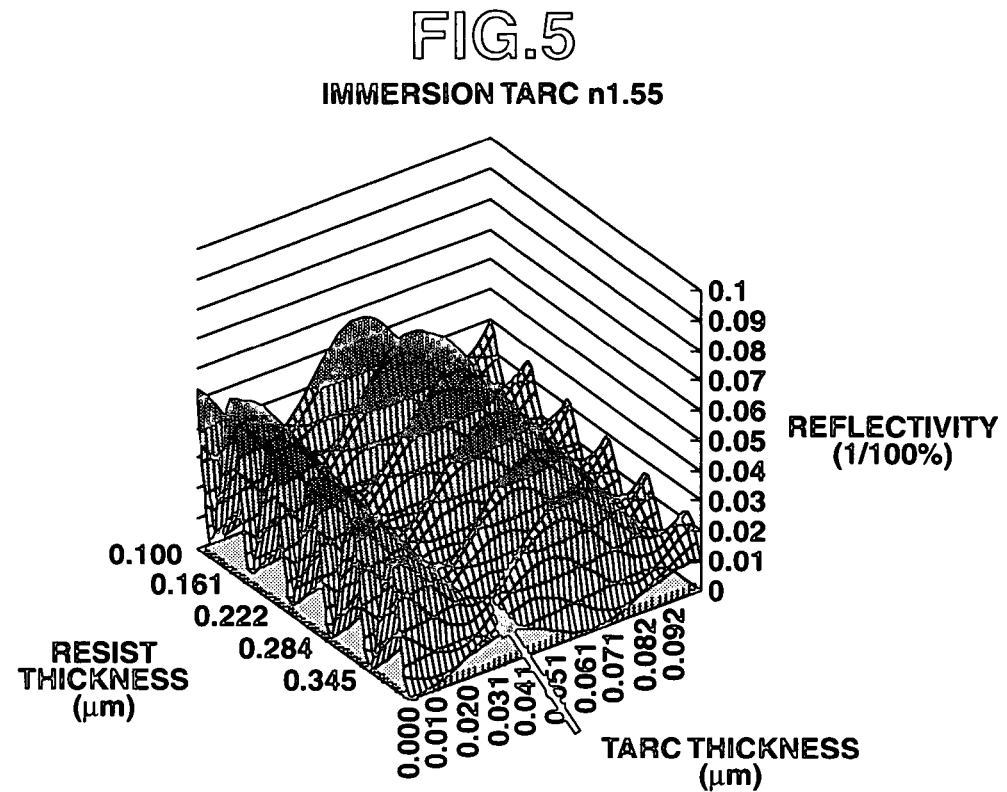
FIG. 5 is a graph of simulated reflectivity for TARC having a refractive index of 1.55.
Figure 6:
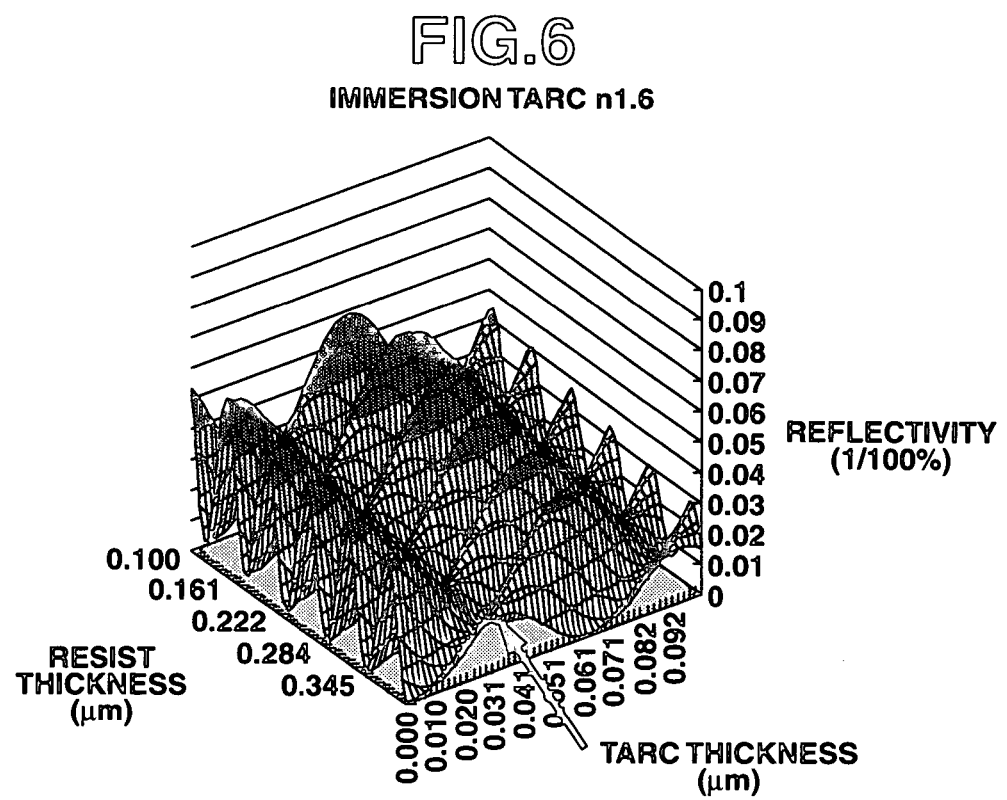
FIG. 6 is a graph of simulated reflectivity for TARC having a refractive index of 1.6.
Figure 7:
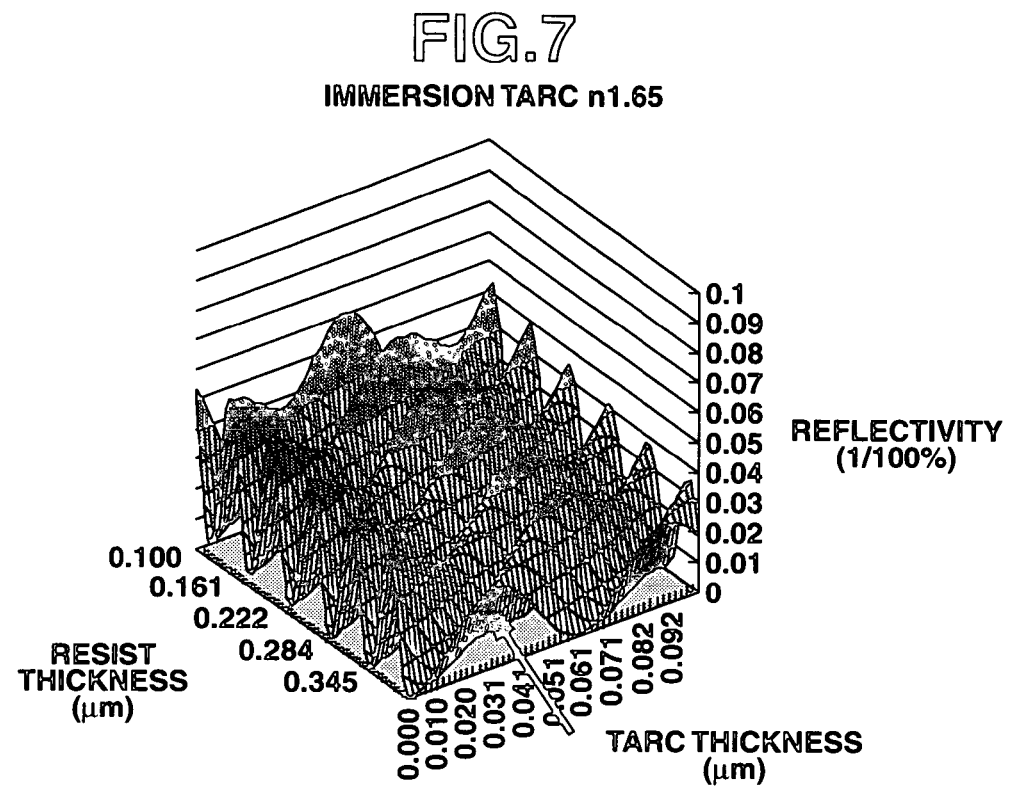
FIG. 7 is a graph of simulated reflectivity for TARC having a refractive index of 1.65.
Figure 8:
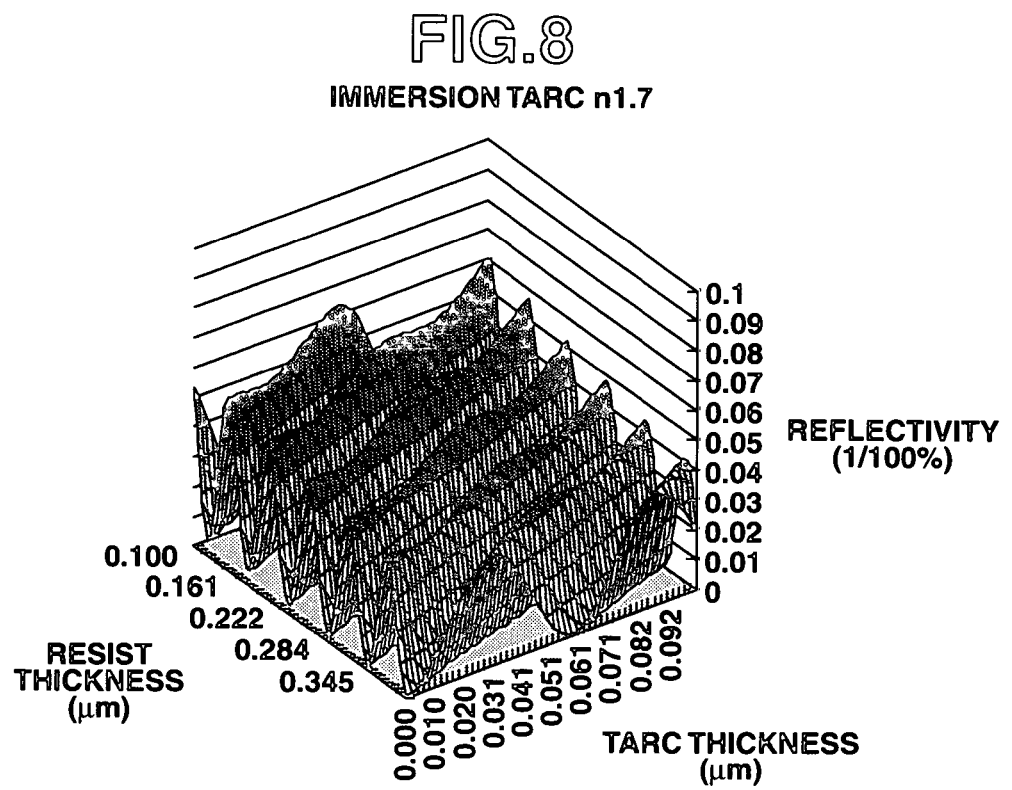
FIG. 8 is a graph of simulated reflectivity for TARC having a refractive index of 1.7.

The polymer or high molecular weight compound of the invention is defined as comprising recurring units having the general formula (1).

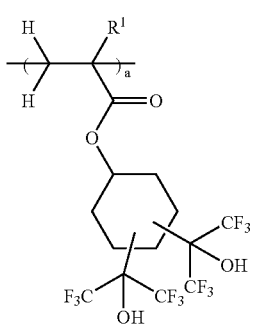

(1)

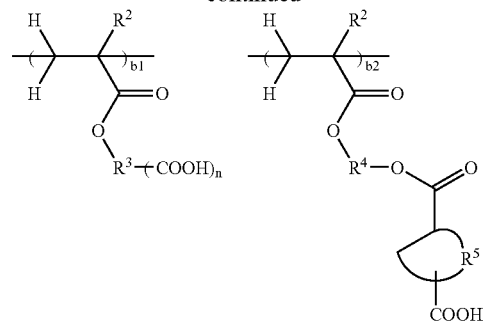

-continued

Herein $R^1$ and $R^2$ each are hydrogen or methyl, $R^3$ is a $C_1$-$C_{12}$ alkylene group when n=1 or an $C_1$-$C_{12}$ alkylidyne group when n=2, which has a straight, branched or cyclic structure, $R^4$ is a $C_1$-$C_{12}$ alkylene group which has a straight, branched or cyclic structure, $R^5$ is a $C_1$-$C_{12}$ alkylene group, subscripts a, $b_1$ and $b_2$ are numbers in the range: $0<a<1$, $0\leq b_1<1$, $0\leq b_2<1$, $0<b_1+b_2<1$, $0<a+b_1+b_2\leq 1.0$, and n is equal to 1 or 2. It is noted that $C_1$-$C_{12}$ means that hydrocarbon groups have 1 to 12 carbon atoms.

Examples of recurring units (a) are given below.

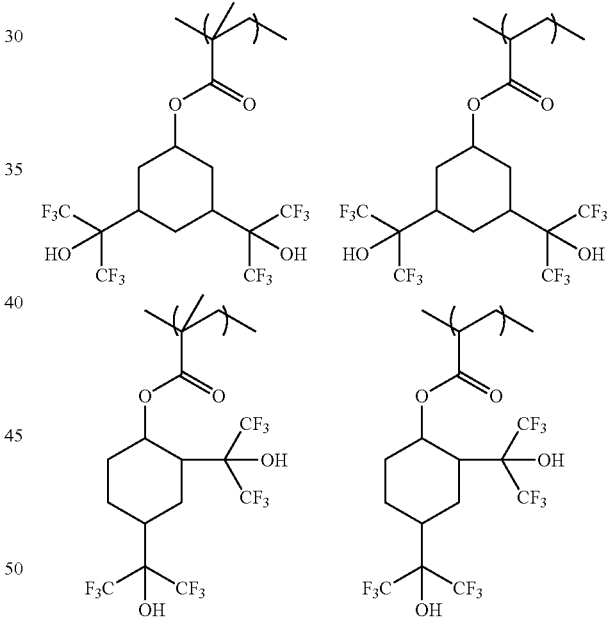

Using a homopolymer consisting of recurring units (a), a resist protective coating can be formed having a dissolution rate of up to 0.1 Å/s in water and a dissolution rate of at least 1,000 Å/s in a developer which is a 2.38 wt % aqueous solution of tetramethylammonium hydroxide (TMAH). This protective coating, however, has a somewhat low refractive index of 1.53. To provide the polymer with an optimum refractive index of 1.57, it is preferred to copolymerize fluorine-free recurring units. For avoiding a drop of alkali dissolution rate, carboxyl-containing recurring units are preferred. For preventing the protective coating from mixing with the resist layer during PEB, the Tg of the polymer should be increased. To this end, recurring units ($b_1$) and ($b_2$) having cyclic carboxyl groups are necessary.

Examples of recurring units (b₁) and (b₂) are given below.
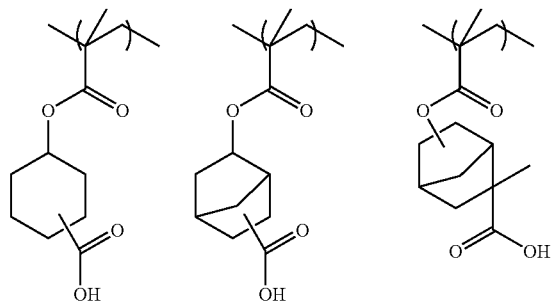
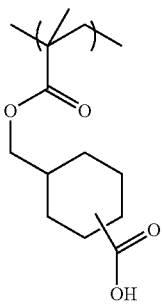
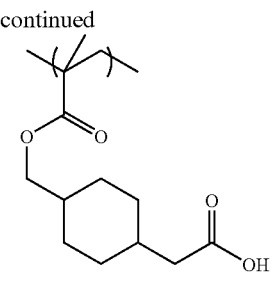
-continued
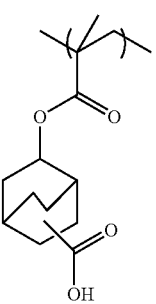
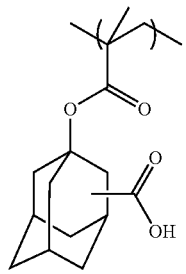
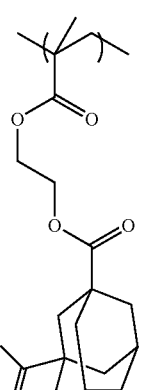
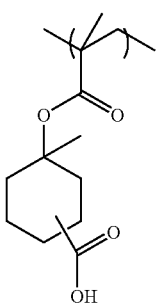
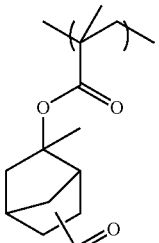
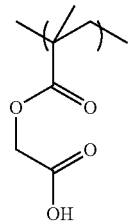
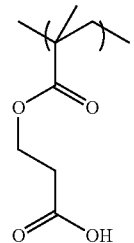
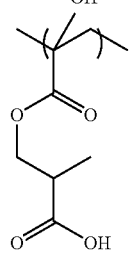
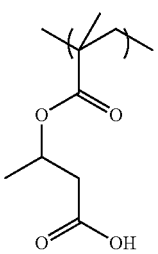
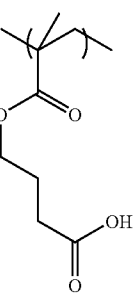

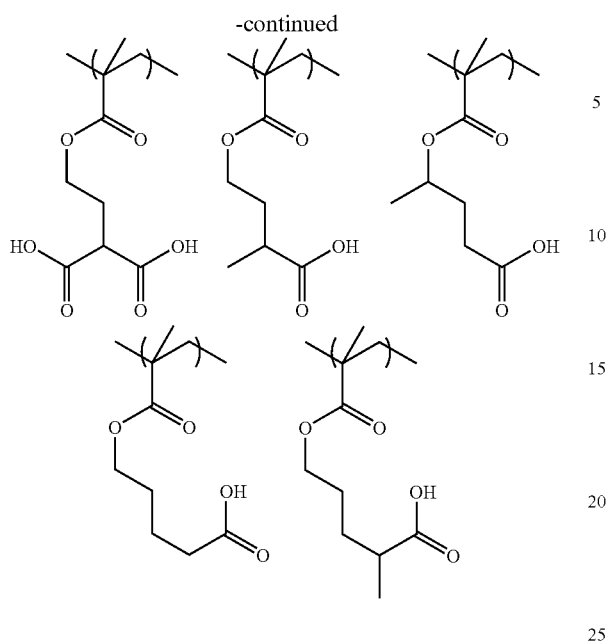

The proportion (molar ratio) of recurring units (a), ($b_1$) and ($b_2$) is in the range: $0<a<1$, $0\leq b_1<1$, $0\leq b_2<1$, $0<b_1+b_2<1$, and $0<a+b_1+b_2\leq 1.0$, preferably in the range: $0.1\leq a\leq 0.9$, $0\leq b_1\leq 0.9$, $0\leq b_2\leq 0.9$, and $0.1\leq b_1+b_2<0.9$, and more preferably in the range: $0.15\leq a\leq 0.85$, $0\leq b_1\leq 0.85$, $0\leq b_2\leq 0.85$, and $0.15\leq b_1+b_2\leq 0.85$.

In addition to the recurring units (a), ($b_1$) and ($b_2$), the polymer used in the resist protective coating according to the invention may have further copolymerized therein acidic units (c) derived from such acids as methacrylic acid, acrylic acid, itaconic acid, and methylenemalonic acid, and units (d) derived from (meth)acrylates having pendant perfluoroalkyl groups, as shown below. In this embodiment, the proportion (molar ratio) of recurring units (a), ($b_1$), ($b_2$), (c) and (d) is preferably in the range: $0\leq c/(a+b_1+b_2+c+d)\leq 0.8$, more preferably $0\leq c/(a+b_1+b_2+c+d)\leq 0.7$, and $0\leq d/(a+b_1+b_2+c+d)\leq 0.9$, more preferably $0\leq d/(a+b_1+b_2+c+d)\leq 0.8$. These units are preferably incorporated to meet: $a+b_1+b_2+c+d=1$.

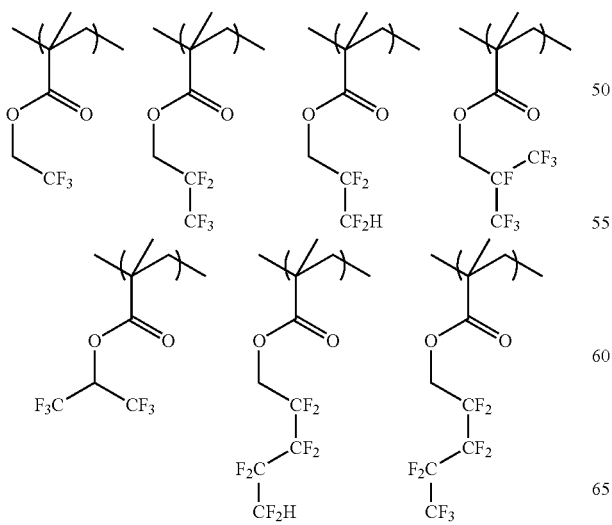

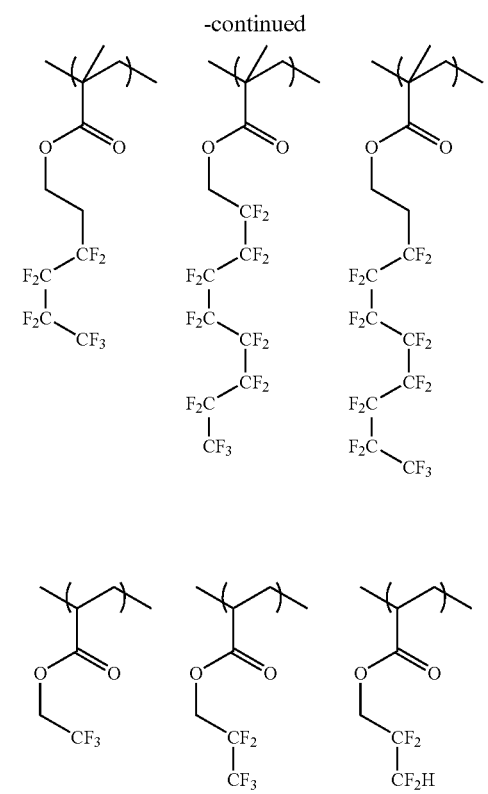

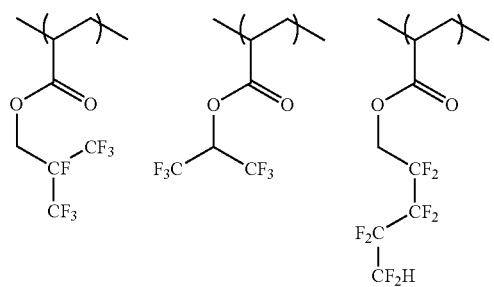

-continued

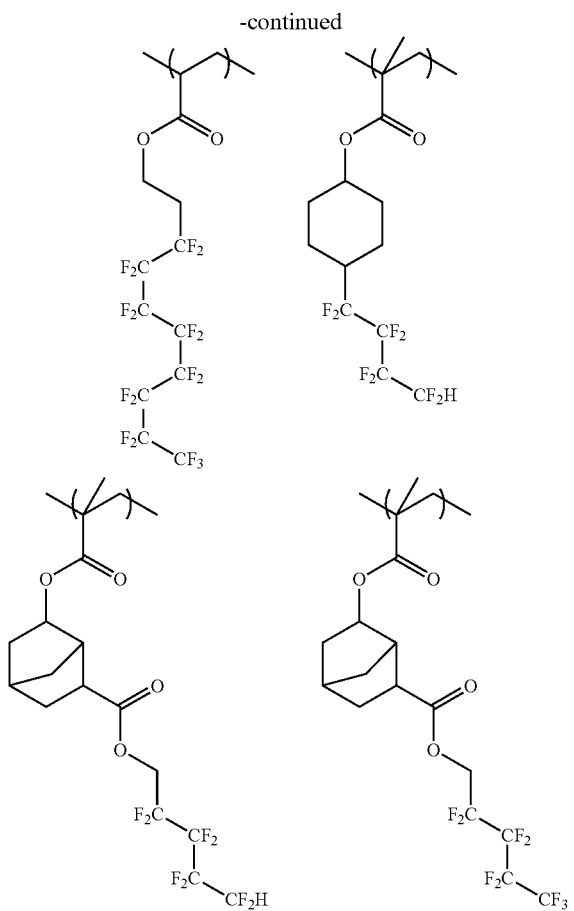

The polymer of the invention should preferably have a weight average molecular weight (Mw) of 1,000 to 500,000, more preferably 2,000 to 30,000, as determined by gel permeation chromatography (GPC) versus polystyrene standards. A polymer with too low a Mw may be miscible with the resist material or dissolvable in water whereas too high a Mw may interfere with film formation after spin coating and lead to a decline of alkali solubility.

The polymer may be synthesized by any desired method, for example, by dissolving unsaturated bond-containing monomers corresponding to the respective units (a), ($b_1$), ($b_2$), (c) and (d) in an organic solvent, adding a radical initiator thereto, and effecting heat polymerization. Examples of the organic solvent which can be used for polymerization include toluene, benzene, tetrahydrofuran, diethyl ether, dioxane, methanol, ethanol and isopropanol. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the system is heated at 50 to 80° C. for polymerization to take place. The reaction time is about 2 to 100 hours, preferably about 5 to 20 hours.

In the practice of the invention, the polymer comprising the recurring units (a), ($b_1$), ($b_2$), (c) and (d) is dissolved in a suitable solvent to form a resist protective coating solution which is ready for use as the resist overlay material. The solvent used herein is not particularly limited although those solvents in which resists can be dissolved should be avoided.

It is recommended to avoid the use of conventional resist solvents, for example, ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate.

Examples of the solvent in which resist layers are not dissolvable include higher alcohols of at least 3 carbon atoms, such as 1-propyl alcohol and isopropyl alcohol; ethers of at least 3 carbon atoms, such as diethyl ether, diisopropyl ether, di-n-propyl ether, di-n-butyl ether, di-tert-butyl ether, diisobutyl ether, di-sec-butyl ether, methyl n-butyl ether, methyl sec-butyl ether, methyl t-butyl ether, methyl t-amyl ether, ethyl n-butyl ether, ethyl sec-butyl ether, ethyl t-butyl ether, ethyl t-amyl ether, methyl cyclopentyl ether, methyl cyclohexyl ether, ethyl cyclopentyl ether, and ethyl cyclohexyl ether; and nonpolar solvents such as toluene, xylene, anisole, hexane and cyclohexane.

Higher alcohols of at least 4 carbon atoms are more preferred. Examples include, but are not limited to, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-diethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, and cyclohexanol.

Fluorinated solvents are also preferred because resist layers are not dissolvable therein. Examples include, but are not limited to, 2-fluoroanisole, 3-fluoroanisole, 4-fluoroanisole, 2,3-difluoroanisole, 2,4-difluoroanisole, 2,5-difluoroanisole, 5,8-difluoro-1,4-benzodioxane, 2,3-difluorobenzyl alcohol, 1,3-difluoro-2-propanol, 2',4'-difluoropropiophenone, 2,4-difluorotoluene, trifluoroacetaldehyde ethyl hemiacetal, trifluoroacetamide, trifluoroethanol, 2,2,2-trifluoroethyl butyrate, ethyl heptafluorobutyrate, ethyl heptafluorobutylacetate, ethyl hexafluoroglutarylmethyl, ethyl 3-hydroxy-4,4,4-trifluorobutyrate, ethyl 2-methyl-4,4,4-trifluoroacetoacetate, ethyl pentafluorobenzoate, ethyl pentafluoropropionate, ethyl pentafluoropropynylacetate, ethyl perfluorooctanoate, ethyl 4,4,4-trifluoroacetoacetate, ethyl 4,4,4-trifluorobutyrate, ethyl 4,4,4-trifluorocrotonate, ethyl trifluorosulfonate, ethyl 3-(trifluoromethyl)butyrate, ethyl trifluoropyruvate, S-ethyl trifluoroacetate, fluorocyclohexane, 2,2,3,3,4,4,4-heptafluoro-1-butanol, 1,1,1,2,2,3,3-heptafluoro-7,7-dimethyl-4,6-octanedione, 1,1,1,3,5,5,5-heptafluoropentane-2,4-dione, 3,3,4,4,5,5,5-heptafluoro-2-pentanol, 3,3,4,4,5,5,5-heptafluoro-2-pentanone, isopropyl 4,4,4-trifluoroacetoacetate, methyl perfluorodecanoate, methyl perfluoro(2-methyl-3-oxahexanoate), methyl perfluorononanoate, methyl perfluorooctanoate, methyl 2,3,3, 3-tetrafluoropropionate, methyl trifluoroacetoacetate, 1,1,1, 2,2,6,6,6-octafluoro-2,4-hexanedione, 2,2,3,3,4,4,5,5-octafluoro-1-pentanol, 1H,1H,2H,2H-perfluoro-1-decanol, perfluoro(2,5-dimethyl-3,6-dioxane anionic) acid methyl ester, 2H-perfluoro-5-methyl-3,6-dioxanonane, 1H,1H,2H, 3H,3H-perfluorononane-1,2-diol, 1H,1H,9H-perfluoro-1-nonanol, 1H,1H-perfluorooctanol, 1H,1H,2H,2H-perfluorooctanol, 2H-perfluoro-5,8,11,14-tetramethyl-3,6,9,12,15-pentaoxa-octadecane, perfluorotributylamine, perfluorotrihexylamine, methyl perfluoro-2,5,8-trimethyl-3, 6,9-trioxadodecanoate, perfluorotripentylamine, perfluorotripropylamine, 1H,1H,2H,3H,3H-perfluoroundecane-1,2-diol, trifluorobutanol, 1,1,1-trifluoro-5-methyl-2,4-hexanedione, 1,1,1-trifluoro-2-propanol, 3,3,3-trifluoro-1-propanol, 1,1,1-trifluoro-2-propyl acetate, perfluorobutyltetrahydrofuran, perfluorodecalin, perfluoro (1,2-dimethylcyclohexane), perfluoro(1,3-dimethylcyclohexane), propylene glycol trifluoromethyl ether acetate, propylene glycol methyl ether trifluoromethyl acetate, butyl trifluoromethylacetate, methyl 3-trifluoromethoxypropionate, perfluorocyclohexanone, propylene glycol trifluoromethyl ether, butyl trifluoroacetate, 1,1,1-trifluoro-5,5-dimethyl-2,4-hexanedione, 1,1,1,3,3,3-hexafluoro-2-propanol, 1,1,1,3,3,3-hexafluoro-2-methyl-2-propanol, 2,2, 3,4,4,4-hexafluoro-1-butanol, 2-trifluoromethyl-2-propanol, 2,2,3,3-tetrafluoro-1-propanol, methyl nonafluorobutyl ether, ethyl nonafluorobutyl ether, propyl nonafluorobutyl ether, and butyl nonafluorobutyl ether.

These solvents may be used alone or in combinations of two or more thereof. The amount of the solvent used is not particularly limited. It is preferably used in a concentration of 0.01 to 10% by weight, more preferably 0.05 to 8% by weight in the resist protective coating material.

The immersion lithography pattern forming process of the invention involves forming a photoresist layer on a wafer, forming a protective coating on the resist layer from a resist overlay material, exposing the layer structure to light having a wavelength in the range of 180 to 250 nm through an projection lens while keeping a water-containing liquid between the projection lens and the wafer, and developing. The process is characterized in that a material comprising the water-insoluble, alkali-soluble polymer of the invention as a base resin is used as the resist overlay material.

Specifically, first the water-insoluble, alkali-soluble resist overlay material is applied to a photoresist layer by suitable techniques, typically spin coating. The coating thickness is preferably in a range of 10 to 500 nm. After spin coating, the coating is baked at a temperature of 40 to 130° C. for 10 to 300 seconds for evaporating off the solvent. Then, light exposure in water is carried out by KrF or ArF immersion lithography. Following the exposure, water is spun off for drying. This is followed by post-exposure bake (PEB), typically at 60 to 180° C. for 10 to 30 seconds, and development in an alkaline developer for 10 to 300 seconds. An aqueous solution of 2.38 wt % tetramethylammonium hydroxide, which is commonly used as the alkaline developer, is used herein whereby stripping of the resist overlay coating and development of the resist layer are simultaneously effected.

The type of photoresist material is not particularly limited, and any of well-known photoresist materials may be used. The photoresist may be either positive or negative working and also either a monolayer resist of conventional hydrocarbon or a bilayer resist containing silicon atoms or the like. For KrF lithography resist materials, the preferred base resins are polyhydroxystyrene or polyhydroxystyrene-(meth)acrylate copolymers in which hydrogen atoms of hydroxyl or carboxyl groups are replaced by acid labile groups.

For ArF lithography resist materials, the base resin must have an aromatic-free structure. Illustrative polymers include polyacrylic acid and derivatives thereof, norbornene derivative-maleic anhydride alternating copolymers and ternary or quaternary copolymers thereof with polyacrylic acid or derivatives thereof, tetracyclododecene derivative-maleic anhydride alternating copolymers and ternary or quaternary copolymers thereof with polyacrylic acid or derivatives thereof, norbornene derivative-maleimide alternating copolymers and ternary or quaternary copolymers thereof with polyacrylic acid or derivatives thereof, tetracyclododecene derivative-maleimide alternating copolymers and ternary or quaternary copolymers thereof with polyacrylic acid or derivatives thereof, and polynorbornene and metathesis ring-opening polymers, and a combination of any.

For the bilayer resist in the ArF exposure, resists comprising silicon-containing polymers derived from silsesquioxane as a base are preferably used.

EXAMPLE

Examples of the invention are given below by way of illustration and not by way of limitation. The abbreviations used herein are GPC for gel permeation chromatography, NMR for nuclear magnetic resonance, Mw for weight average molecular weight, Mn for number average molecular weight, and Mw/Mn for molecular weight dispersity. Mw and Mn are determined by GPC versus polystyrene standards.

Synthesis Example 1

A 200-ml flask was charged with 45 g of Monomer 1, 7 g of Monomer 2, and 40 g of methanol as a solvent. The reactor was subjected to cooling to −70° C. in a nitrogen atmosphere, evacuation to vacuum, and nitrogen flow, which procedure was repeated three times. The reactor was warmed up to room temperature, charged with 3 g of 2,2'-azobis(2,4-dimethylvaleronitrile) as a polymerization initiator, heated at 65° C., and held for 25 hours for reaction. The reaction solution was poured into hexane for crystallization whereupon the resin was isolated. The resin, designated Inventive Polymer 1, was analyzed for composition by $^1$H-NMR and for molecular weight by GPC.

Synthesis Example 2

A 200-ml flask was charged with 45 g of Monomer 1, 7 g of Monomer 3, and 40 g of methanol as a solvent. The reactor was subjected to cooling to −70° C. in a nitrogen atmosphere, evacuation to vacuum, and nitrogen flow, which procedure was repeated three times. The reactor was warmed up to room temperature, charged with 3 g of 2,2'-azobis(2,4-dimethylvaleronitrile) as a polymerization initiator, heated at 65° C., and held for 25 hours for reaction. The reaction solution was poured into hexane for crystallization whereupon the resin was isolated. The resin, designated Inventive Polymer 2, was analyzed for composition by $^1$H-NMR and for molecular weight by GPC.

Synthesis Example 3

A 200-ml flask was charged with 25 g of Monomer 1, 5 g of Monomer 2, 15 g of Monomer 4, and 40 g of methanol as a solvent. The reactor was subjected to cooling to −70° C. in a nitrogen atmosphere, evacuation to vacuum, and nitrogen flow, which procedure was repeated three times. The reactor was warmed up to room temperature, charged with 3 g of 2,2'-azobis(2,4-dimethylvaleronitrile) as a polymerization initiator, heated at 65° C., and held for 25 hours for reaction. The reaction solution was poured into hexane for crystallization whereupon the resin was isolated. The resin, designated Inventive Polymer 3, was analyzed for composition by $^1$H-NMR and for molecular weight by GPC.

Synthesis Example 4

A 200-ml flask was charged with 25 g of Monomer 1, 4 g of Monomer 5, 15 g of Monomer 4, and 40 g of methanol as a solvent. The reactor was subjected to cooling to −70° C. in a nitrogen atmosphere, evacuation to vacuum, and nitrogen flow, which procedure was repeated three times. The reactor was warmed up to room temperature, charged with 3 g of 2,2'-azobis(2,4-dimethylvaleronitrile) as a polymerization initiator, heated at 65° C., and held for 25 hours for reaction. The reaction solution was poured into hexane for crystallization whereupon the resin was isolated. The resin, designated Inventive Polymer 4, was analyzed for composition by $^1$H-NMR and for molecular weight by GPC.

Synthesis Example 5

A 200-ml flask was charged with 25 g of Monomer 1, 4 g of Monomer 5, 10 g of Monomer 6, and 40 g of methanol as a solvent. The reactor was subjected to cooling to −70° C. in a nitrogen atmosphere, evacuation to vacuum, and nitrogen flow, which procedure was repeated three times. The reactor was warmed up to room temperature, charged with 3 g of 2,2'-azobis(2,4-dimethylvaleronitrile) as a polymerization initiator, heated at 65° C., and held for 25 hours for reaction. The reaction solution was poured into hexane for crystallization whereupon the resin was isolated. The resin, designated Inventive Polymer 5, was analyzed for composition by $^1$H-NMR and for molecular weight by GPC.

Synthesis Example 6

A 200-ml flask was charged with 25 g of Monomer 1, 4 g of Monomer 5, 19 g of Monomer 7, and 40 g of methanol as a solvent. The reactor was subjected to cooling to −70° C. in a nitrogen atmosphere, evacuation to vacuum, and nitrogen flow, which procedure was repeated three times. The reactor was warmed up to room temperature, charged with 3 g of 2,2'-azobis(2,4-dimethylvaleronitrile) as a polymerization initiator, heated at 65° C., and held for 25 hours for reaction. The reaction solution was poured into hexane for crystallization whereupon the resin was isolated. The resin, designated Inventive Polymer 6, was analyzed for composition by $^1$H-NMR and for molecular weight by GPC.

Synthesis Example 7

A 200-ml flask was charged with 20 g of Monomer 1, 3 g of Monomer 2, 16 g of Monomer 4, 5 g of methacrylic acid, and 40 g of methanol as a solvent. The reactor was subjected to cooling to −70° C. in a nitrogen atmosphere, evacuation to vacuum, and nitrogen flow, which procedure was repeated three times. The reactor was warmed up to room temperature, charged with 3 g of 2,2'-azobis(2,4-dimethylvaleronitrile) as a polymerization initiator, heated at 65° C., and held for 25 hours for reaction. The reaction solution was poured into hexane for crystallization whereupon the resin was isolated. The resin, designated Inventive Polymer 7, was analyzed for composition by $^1$H-NMR and for molecular weight by GPC.

Synthesis Example 8

A 200-ml flask was charged with 25 g of Monomer 1, 4 g of Monomer 8, 14 g of Monomer 4, and 40 g of methanol as a solvent. The reactor was subjected to cooling to −70° C. in a nitrogen atmosphere, evacuation to vacuum, and nitrogen flow, which procedure was repeated three times. The reactor was warmed up to room temperature, charged with 3 g of 2,2'-azobis(2,4-dimethylvaleronitrile) as a polymerization initiator, heated at 65° C., and held for 25 hours for reaction. The reaction solution was poured into hexane for crystallization whereupon the resin was isolated. The resin, designated Inventive Polymer 8, was analyzed for composition by $^1$H-NMR and for molecular weight by GPC.

Synthesis Example 9

A 200-ml flask was charged with 25 g of Monomer 1, 5 g of Monomer 9, 14 g of Monomer 4, and 40 g of methanol as a solvent. The reactor was subjected to cooling to −70° C. in a nitrogen atmosphere, evacuation to vacuum, and nitrogen flow, which procedure was repeated three times. The reactor was warmed up to room temperature, charged with 3 g of 2,2'-azobis(2,4-dimethylvaleronitrile) as a polymerization initiator, heated at 65° C., and held for 25 hours for reaction. The reaction solution was poured into hexane for crystallization whereupon the resin was isolated. The resin, designated Inventive Polymer 9, was analyzed for composition by $^1$H-NMR and for molecular weight by GPC.

Synthesis Example 10

A 200-ml flask was charged with 25 g of Monomer 1, 7 g of Monomer 10, 14 g of Monomer 4, and 40 g of methanol as a solvent. The reactor was subjected to cooling to −70° C. in a nitrogen atmosphere, evacuation to vacuum, and nitrogen flow, which procedure was repeated three times. The reactor was warmed up to room temperature, charged with 3 g of 2,2'-azobis(2,4-dimethylvaleronitrile) as a polymerization initiator, heated at 65° C., and held for 25 hours for reaction. The reaction solution was poured into hexane for crystallization whereupon the resin was isolated. The resin, designated Inventive Polymer 10, was analyzed for composition by $^1$H-NMR and for molecular weight by GPC.

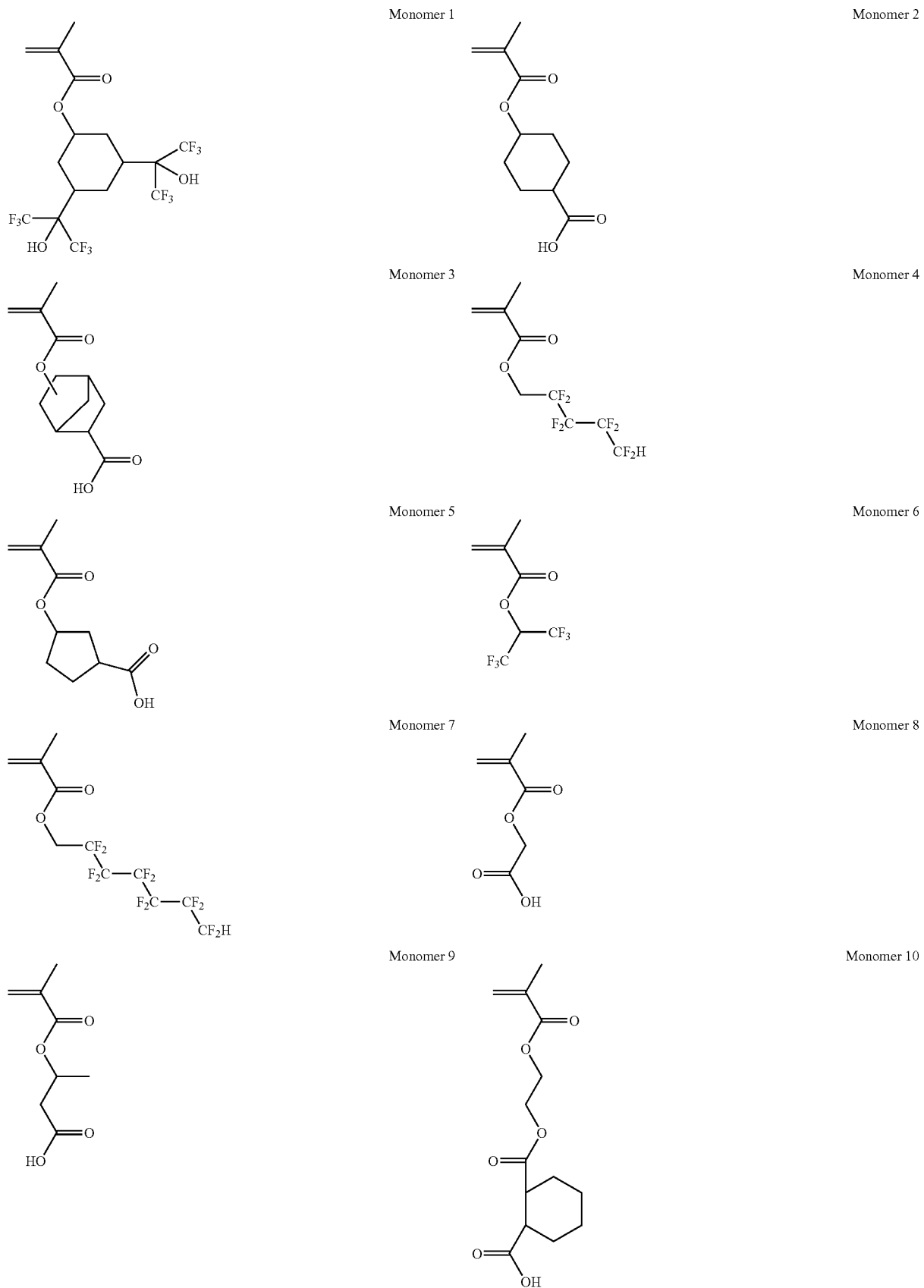

-continued
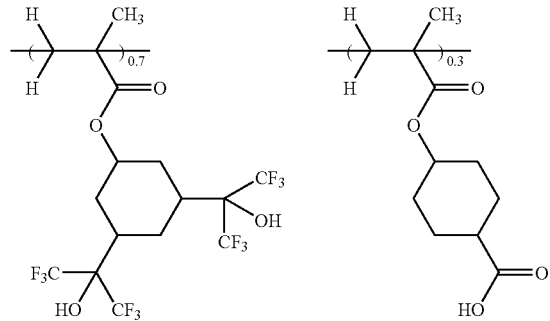
Mw 11,000 Mw/Mn 1.78
Inventive Polymer 1
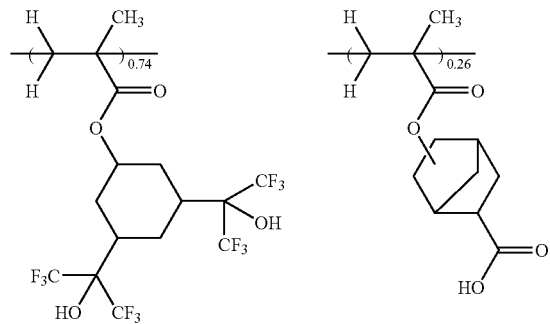
Mw 11,600 Mw/Mn 1.72
Inventive Polymer 2
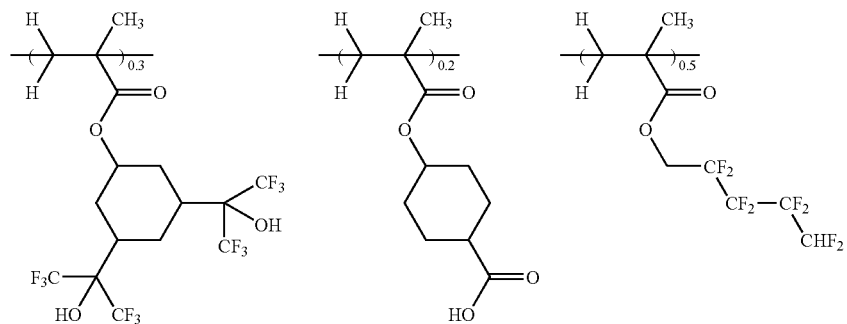
Mw 10,300 Mw/Mn 1.77
Inventive Polymer 3
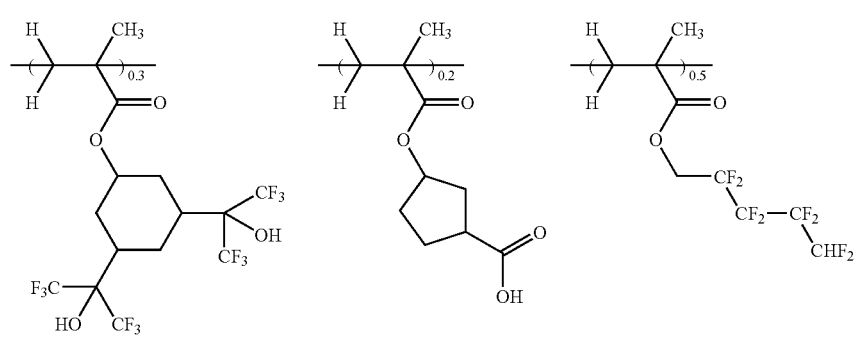
Mw 9,200 Mw/Mn 1.68
Inventive Polymer 4

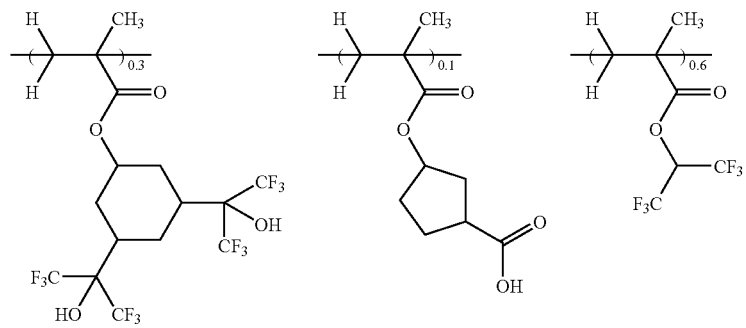
Inventive Polymer 5
Mw 8,800 Mw/Mn 1.65
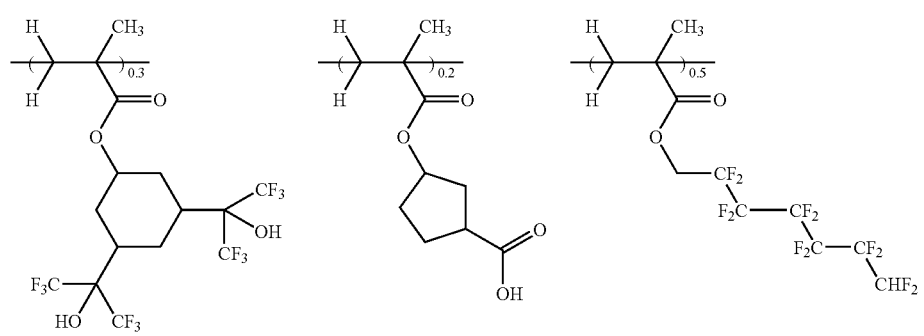
Inventive Polymer 6
Mw 7,800 Mw/Mn 1.53
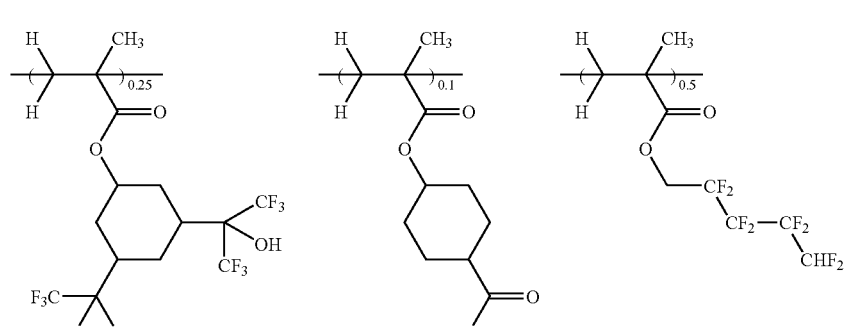
Inventive Polymer 7
Mw 9,300 Mw/Mn 1.67
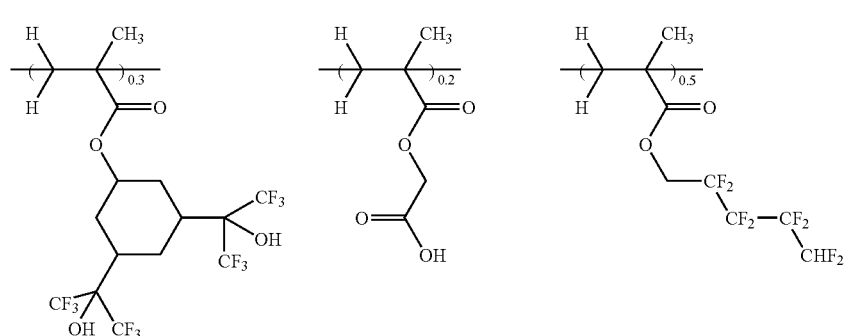
Inventive Polymer 8
Mw 8,800 Mw/Mn 1.56

Inventive Polymer 9

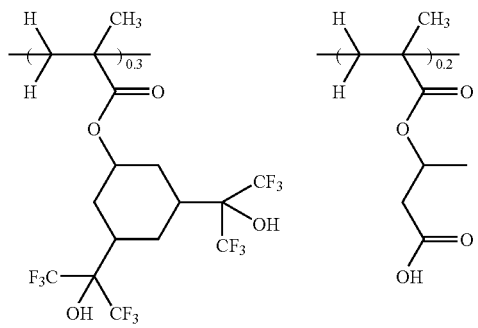

Mw 8,600 Mw/Mn 1.68

Inventive Polymer 10

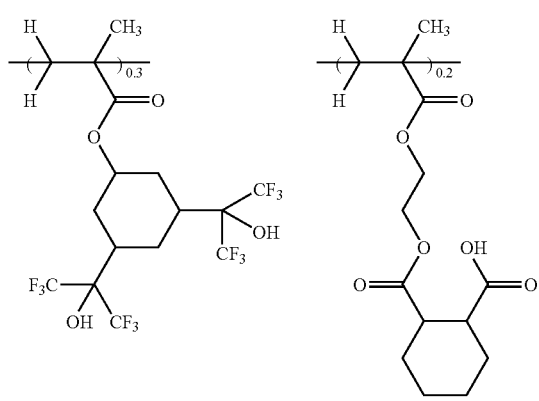

Mw 8,800 Mw/Mn 1.63

Comparative Examples 1-2

Comparative Polymers 1 and 2 were prepared by a conventional procedure.

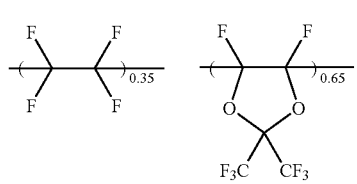

Comparative Polymer 1

Mw 23,000 Mw/Mn 2.3

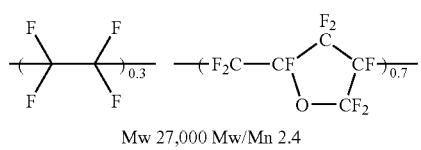

Comparative Polymer 2

Mw 27,000 Mw/Mn 2.4

Comparative Synthesis Example 1

A 200-ml flask was charged with 40 g of Monomer 1 and 40 g of methanol as a solvent. The reactor was subjected to cooling to −70° C. in a nitrogen atmosphere, evacuation to vacuum, and nitrogen flow, which procedure was repeated three times. The reactor was warmed up to room temperature, charged with 3 g of 2,2'-azobis(2,4-dimethylvaleronitrile) as a polymerization initiator, heated at 65° C., and held for 25 hours for reaction. The reaction solution was poured into hexane for crystallization whereupon the resin was isolated. The resin, designated Comparative Polymer 3, was analyzed for composition by $^1$H-NMR and for molecular weight by GPC.

Comparative Synthesis Example 2

A 200-ml flask was charged with 28 g of Monomer 1, 14 g of Monomer 4, and 40 g of methanol as a solvent. The reactor was subjected to cooling to −70° C. in a nitrogen atmosphere, evacuation to vacuum, and nitrogen flow, which procedure was repeated three times. The reactor was warmed up to room temperature, charged with 3 g of 2,2'-azobis(2,4-dimethylvaleronitrile) as a polymerization initiator, heated at 65° C., and held for 25 hours for reaction. The reaction solution was poured into hexane for crystallization whereupon the resin was isolated. The resin, designated Comparative Polymer 4, was analyzed for composition by $^1$H-NMR and for molecular weight by GPC.

Comparative Polymer 3

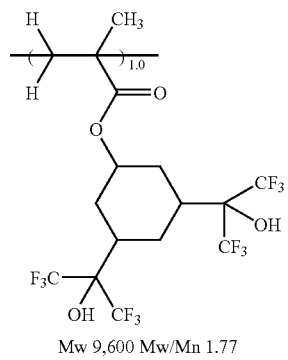

Mw 9,600 Mw/Mn 1.77

Comparative Polymer 4

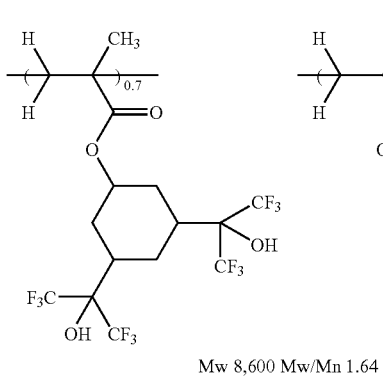

Mw 8,600 Mw/Mn 1.64

Resist protective coating solutions were prepared by dissolving Inventive Polymers 1 to 10 and Comparative Polymers 1 to 4 in a solvent as shown in Table 1 and passing through a polypropylene filter having a pore size of 0.2 μm.

TABLE 1

| | Polymer for protective coating (pbw) | Solvent (pbw) |
|---|---|---|
| Protective coating 1 | Inventive Polymer 1 (1.0) | isobutyl alcohol (25) |
| Protective coating 2 | Inventive Polymer 2 (1.0) | isobutyl alcohol (25) |
| Protective coating 3 | Inventive Polymer 3 (1.0) | isobutyl alcohol (25) |
| Protective coating 4 | Inventive Polymer 4 (1.0) | isobutyl alcohol (25) |
| Protective coating 5 | Inventive Polymer 5 (1.0) | isobutyl alcohol (25) |
| Protective coating 6 | Inventive Polymer 6 (1.0) | isobutyl alcohol (25) |
| Protective coating 7 | Inventive Polymer 7 (1.0) | isobutyl alcohol (25) |
| Protective coating 8 | Inventive Polymer 8 (1.0) | isobutyl alcohol (25) |
| Protective coating 9 | Inventive Polymer 9 (1.0) | isobutyl alcohol (25) |
| Protective coating 10 | Inventive Polymer 9 (1.0) | methyl cyclopentyl ether (25) |
| Protective coating 11 | Inventive Polymer 9 (1.0) | ethyl t-amyl ether (25) |
| Protective coating 12 | Inventive Polymer 9 (1.0) | 3-methyl-3-pentanol (25) |
| Protective coating 13 | Inventive Polymer 10 (1.0) | isobutyl alcohol (25) |

TABLE 1-continued

| | Polymer for protective coating (pbw) | Solvent (pbw) |
|---|---|---|
| Comparative protective coating 1 | Comparative Polymer 1 (1.0) | perfluorotri-n-butylamine (25) |
| Comparative protective coating 2 | Comparative Polymer 2 (1.0) | perfluorotri-n-butylamine (25) |
| Comparative protective coating 3 | Comparative Polymer 3 (1.0) | isobutyl alcohol (25) |
| Comparative protective coating 4 | Comparative Polymer 4 (1.0) | isobutyl alcohol (25) |

The resist protective coating solutions were spin coated onto silicon substrates and baked at 100° C. for 60 seconds to form protective coatings of 50 nm thick. Using a spectroscopic ellipsometer by J. A. Woollam Co., Inc., the refractive index at wavelength 193 nm of the protective coatings was measured. The results are shown in Table 2.

TABLE 2

| Protective coating | Refractive index at 193 nm |
|---|---|
| Protective coating 1 | 1.57 |
| Protective coating 2 | 1.58 |
| Protective coating 3 | 1.56 |
| Protective coating 4 | 1.55 |
| Protective coating 5 | 1.59 |
| Protective coating 6 | 1.53 |
| Protective coating 7 | 1.56 |
| Protective coating 8 | 1.57 |
| Protective coating 9 | 1.57 |
| Protective coating 10 | 1.57 |
| Protective coating 11 | 1.57 |
| Protective coating 12 | 1.57 |
| Protective coating 13 | 1.58 |
| Comparative protective coating 1 | 1.38 |
| Comparative protective coating 2 | 1.36 |
| Comparative protective coating 3 | 1.54 |
| Comparative protective coating 4 | 1.53 |

The wafers on which the resist protective coatings had been formed by the above procedure were rinsed with deionized water for 5 minutes. A change of coating thickness was examined. The results are shown in Table 3.

TABLE 3

| Protective coating | Coating thickness change before and after rinsing (nm) |
|---|---|
| Protective coating 1 | 0 |
| Protective coating 2 | 0 |
| Protective coating 3 | 0 |
| Protective coating 4 | 0 |
| Protective coating 5 | 0 |
| Protective coating 6 | 0 |
| Protective coating 7 | 0 |
| Protective coating 8 | 0 |
| Protective coating 9 | 0 |
| Protective coating 10 | 0 |
| Protective coating 11 | 0 |
| Protective coating 12 | 0 |
| Protective coating 13 | 0 |
| Comparative protective coating 1 | 0 |
| Comparative protective coating 2 | 0 |
| Comparative protective coating 3 | 0 |
| Comparative protective coating 4 | 0 |

The wafers on which the resist protective coatings had been formed by the above procedure were developed with a 2.38% TMAH aqueous solution. The coatings as developed were measured for thickness. The results are shown in Table 4.

TABLE 4

| Protective coating | Coating thickness after development (nm) |
|---|---|
| Protective coating 1 | 0 |
| Protective coating 2 | 0 |
| Protective coating 3 | 0 |
| Protective coating 4 | 0 |
| Protective coating 5 | 0 |
| Protective coating 6 | 0 |
| Protective coating 7 | 0 |
| Protective coating 8 | 0 |
| Protective coating 9 | 0 |
| Protective coating 10 | 0 |
| Protective coating 11 | 0 |
| Protective coating 12 | 0 |
| Protective coating 13 | 0 |
| Comparative protective coating 1 | 40 (no change in coating thickness) |
| Comparative protective coating 2 | 40 (no change in coating thickness) |
| Comparative protective coating 3 | 0 |
| Comparative protective coating 4 | 0 |

Next, a resist solution was prepared by dissolving 5 g of a resist polymer, shown below, 0.15 g of a photoacid generator PAG, shown below, and 0.4 g of tri-n-butylamine as a quencher in 50 g of propylene glycol monoethyl ether acetate (PGMEA) and passing through a polypropylene filter having a pore size of 0.2 μm. An antireflective coating ARC-29A (Nissan Chemical Co., Ltd.) was formed on a silicon substrate to a thickness of 78 nm. The resist solution was applied onto the antireflective coating and baked at 130° C. for 60 seconds, forming a resist film of 200 nm thick. The resist protective coating solution was applied onto the resist film and baked at 100° C. for 60 seconds. In order to simulate immersion lithography, after light exposure, the coating was rinsed with deionized water for 5 minutes. The structure was exposed by means of an ArF scanner model S305B (Nikon Corp., NA 0.68, σ 0.85, ⅔ annular illumination, Cr mask), rinsed for 5 minutes while splashing deionized water, post-exposure baked (PEB) at 120° C. for 60 seconds, and developed with a 2.38% TMAH aqueous solution for 60 seconds.

In the absence of the protective coating, a similar process including light exposure, water rinsing, PEB and development was carried out; and a conventional process excluding water rinsing after exposure was also carried out.

The wafers were sectioned for comparing the profile of 110-nm line-and-space pattern and sensitivity. The results are shown in Table 5.

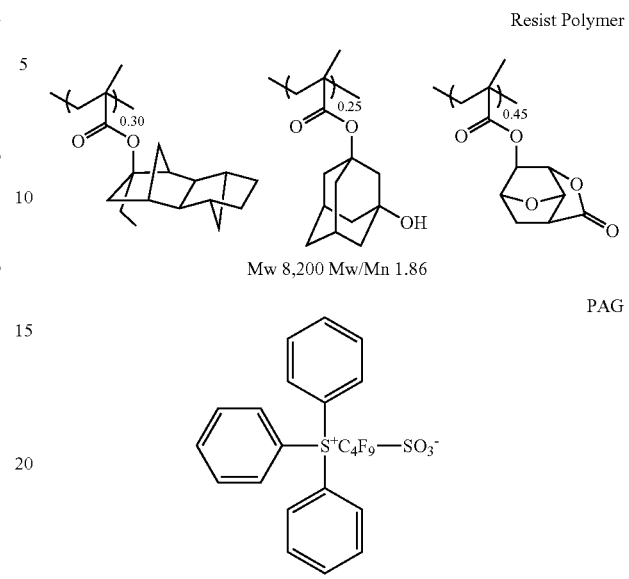

Mw 8,200 Mw/Mn 1.86

TABLE 5

| Protective coating | Sensitivity, 110 nm pattern profile |
|---|---|
| no protective coating, conventional process excluding rinsing after exposure | 30 mJ/cm², rectangular |
| Protective coating 1 | 29 mJ/cm², rectangular |
| Protective coating 2 | 29 mJ/cm², rectangular |
| Protective coating 3 | 30 mJ/cm², rectangular |
| Protective coating 4 | 30 mJ/cm², rectangular |
| Protective coating 5 | 30 mJ/cm², rectangular |
| Protective coating 6 | 30 mJ/cm², rectangular |
| Protective coating 7 | 30 mJ/cm², rectangular |
| Protective coating 8 | 30 mJ/cm², rectangular |
| Protective coating 9 | 30 mJ/cm², rectangular |
| Protective coating 10 | 30 mJ/cm², rectangular |
| Protective coating 11 | 30 mJ/cm², rectangular |
| Protective coating 12 | 30 mJ/cm², rectangular |
| Protective coating 13 | 30 mJ/cm², rectangular |
| no protective coating | 30 mJ/cm², T-top |
| Comparative protective coating 1 | protective coating not stripped, pattern not resolved |
| Comparative protective coating 2 | protective coating not stripped, pattern not resolved |
| Comparative protective coating 3 | 30 mJ/cm², slimming and tapered profile |
| Comparative protective coating 4 | 30 mJ/cm², tapered profile |

A resist protective coating solution was prepared by dissolving 0.5 g of Comparative Polymer 1 or 2 in 20 g of perfluorotributylamine and passing through a polypropylene filter having a pore size of 0.2 μm.

A resist solution was prepared by dissolving 5 g of the resist polymer, 0.15 g of PAG, and 0.25 g of tri-methoxymethoxyethylamine (TMMEA) as a quencher in 50 g of propylene glycol monoethyl ether acetate (PGMEA) and passing through a polypropylene filter having a pore size of 0.2 μm. An antireflective coating ARC-29A (Nissan Chemical Co., Ltd.) was formed on a silicon substrate to a thickness of 78 nm. The resist solution was applied onto the antireflective coating and baked at 130° C. for 60 seconds, forming a resist film of 200 nm thick. The resist protective coating solution was applied onto the resist film and baked at 80° C. for 60 seconds. In order to simulate immersion lithography, after light exposure, the coating was rinsed with deionized water. The structure was exposed by means of an ArF scanner model S305B (Nikon Corp., NA 0.68, σ 0.85, ⅔ annular illumination, Cr mask), rinsed for 5 minutes while splashing deionized water, post-exposure baked (PEB) at 120° C. for 60 seconds, and developed with a 2.38% TMAH aqueous solution for 60 seconds.

A pattern was formed by applying a protective coating solution based on Comparative Polymer 1 or 2 onto a resist film, exposing, PEB, rinsing with deionized water, rinsing with perfluoro-2-butyltetrahydrofuran to strip off the protective coating, and development. The wafers were sectioned for comparing the profile of 110-nm line-and-space pattern and sensitivity. The results are shown in Table 6.

TABLE 6

| Protective coating | Sensitivity, 110 nm pattern profile |
|---|---|
| Comparative protective coating 1 | 30 mJ/cm$^2$, rectangular |
| Comparative protective coating 2 | 30 mJ/cm$^2$, rectangular |

When exposure was followed by deionized water rinsing in the absence of the protective coating, the pattern had a T-top profile. This is because the acid generated was dissolved in water. The pattern profile remained unchanged when the protective coating of the invention was used. With respect to the protective coatings of perfluoro-polymers proposed in the art, the pattern profile was acceptable when the coating was stripped with a fluorocarbon solvent, but the coating could not be stripped with alkaline water. In the case of the polymers consisting of recurring units (a) in Comparative Examples 3 and 4, the resist profile after development was tapered due to slimming or top-loss.

Japanese Patent Application Nos. 2004-229085 and 2005-155103 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A polymer comprising recurring units having the general formula (1) and recurring units (d) derived from (meth)acrylates having pendant perfluoroalkyl groups:

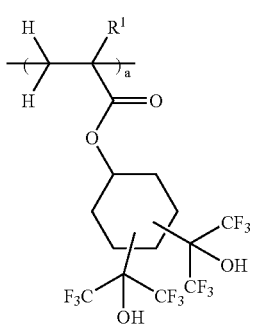

(1)

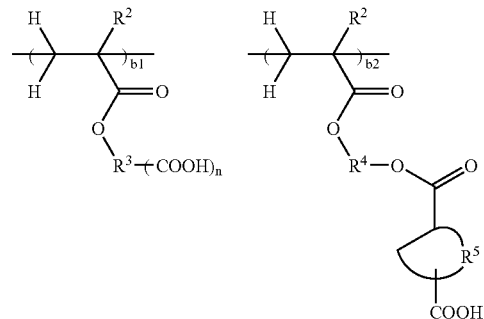

wherein $R^1$ and $R^2$ each are hydrogen or methyl, $R^3$ is a $C_1$-$C_{12}$ alkylene group when n=1 or a $C_1$-$C_{12}$ alkylidyne group when n=2, which has a straight, branched or cyclic structure, $R^4$ is a $C_1$-$C_{12}$ alkylene group which has a straight, branched or cyclic structure, $R^5$ is a $C_1$-$C_{12}$ alkylene group, subscripts a, $b_1$ and $b_2$ are numbers in the range: $0<a<1$, $0 \leq b_1 <1$, $0 \leq b_2 <1$, $0<b_1+b_2<1$, $0<a+b_1+b_2 \leq 1.0$, and n is equal to 1 or 2, and said recurring units (d) derived from (meth)acrylates having pendant perfluoroalkyl groups being at least one selected from the group consisting of units having the following formulae:

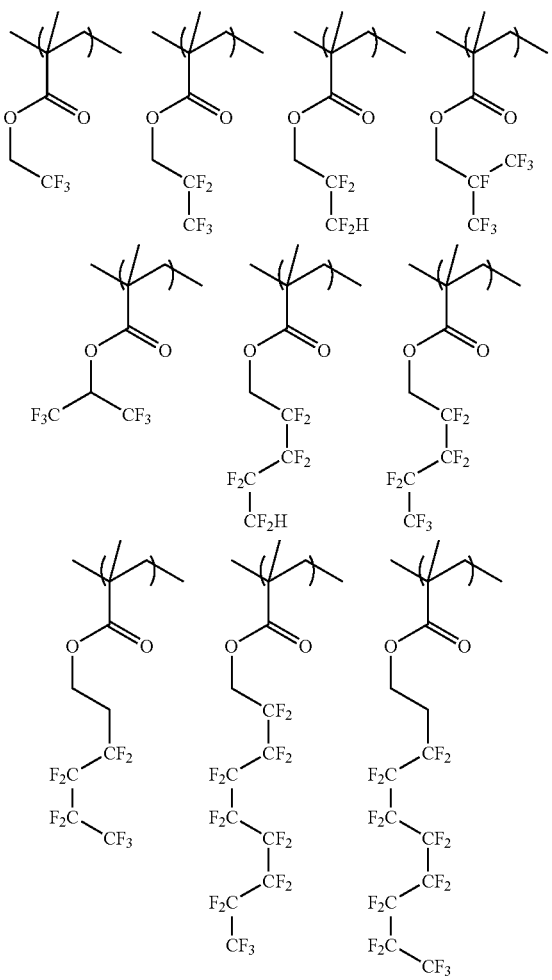

-continued

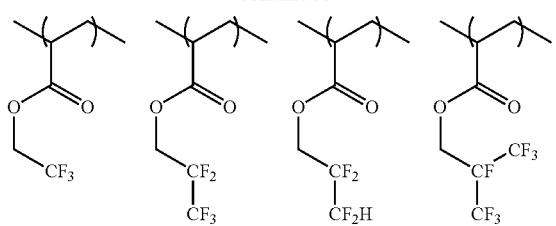

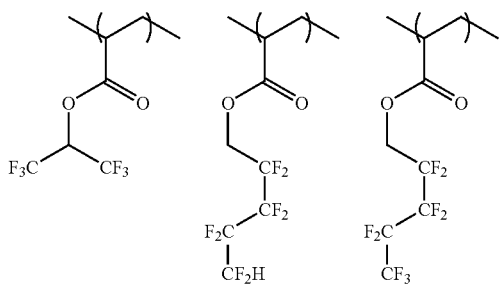

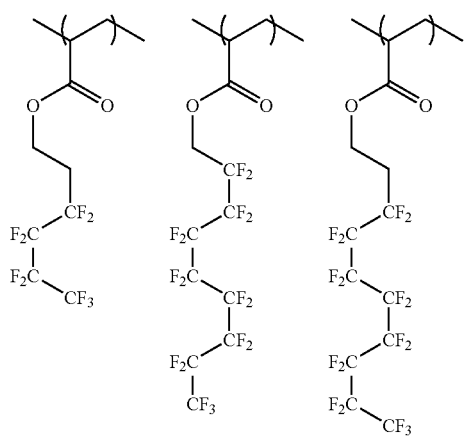

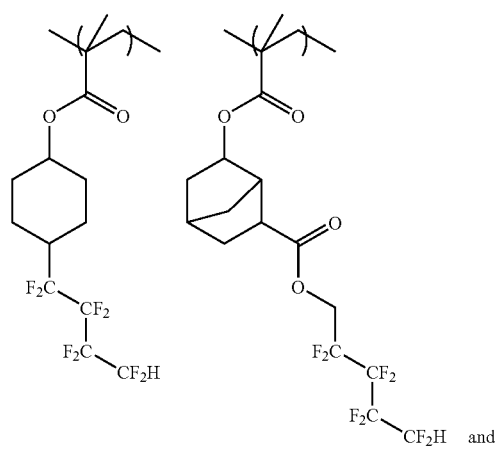

-continued

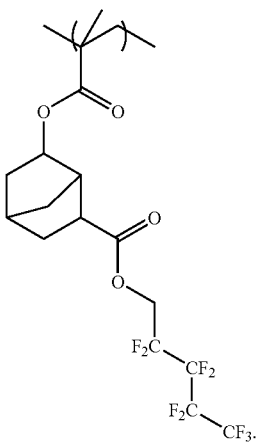

2. A resist protective coating material comprising the polymer of claim 1.

3. An immersion lithography process for forming a pattern, comprising the steps of forming a resist layer on a wafer, forming a protective coating on the resist layer from a resist overlay material, and exposing the layer structure to light having a wavelength in the range of 180 to 250 nm through an projection lens while keeping a water-containing liquid between the projection lens and the wafer, said resist overlay material being the resist protective coating material of claim 2.

4. The pattern forming process of claim 3, further comprising, after the exposing step, the steps of post-exposure baking and then developing the layer structure with alkaline water, said developing step serving to develop the resist layer and strip the protective coating of resist overlay material at the same time.

5. A polymer comprising recurring units having the general formula (1'):

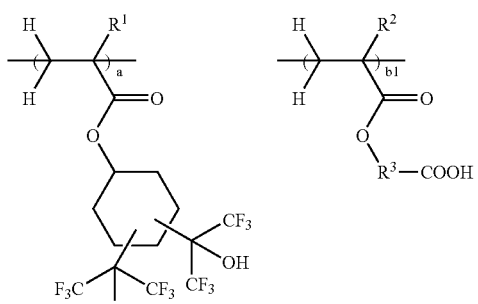

(1')

wherein $R^1$ and $R^2$ each are hydrogen or methyl, $R^3$ is a $C_3$-$C_{12}$ alkylene group, which has a cyclic structure, subscripts a and b are numbers in the range: $0<a<1$, $0<b1<1$, and $a+b1=1.0$.

6. A resist protective coating material comprising the polymer of claim 5.

7. An immersion lithography process for forming a pattern, comprising the steps of forming a resist layer on a wafer, forming a protective coating on the resist layer from a resist overlay material, and exposing the layer structure to light having a wavelength in the range of 180 to 250 nm through an projection lens while keeping a water-containing liquid between the projection lens and the wafer, said resist overlay material being the resist protective coating material of claim 6.

8. The pattern forming process of claim 7, further comprising, after the exposing step, the steps of post-exposure baking and then developing the layer structure with alkaline water, said developing step serving to develop the resist layer and strip the protective coating of resist overlay material at the same time.

* * * * *